United States Patent [19]
Dubois et al.

[11] Patent Number: 5,562,472
[45] Date of Patent: Oct. 8, 1996

[54] CONTACT-MAKING DEVICE FOR CONNECTING A CONDUCTOR FILM WHICH HAS A PLURALITY OF CONTACT CONDUCTOR TRACKS

[75] Inventors: Dieter Dubois, Augsburg; Franz Wandinger, München, both of Germany

[73] Assignee: Siemens Nixdorf Informationssysteme Aktiengesellschaft, Paderborn, Germany

[21] Appl. No.: 406,928

[22] PCT Filed: Sep. 16, 1993

[86] PCT No.: PCT/DE93/00873

§ 371 Date: Mar. 29, 1995

§ 102(e) Date: Mar. 29, 1995

[87] PCT Pub. No.: WO94/08366

PCT Pub. Date: Apr. 14, 1994

[30] Foreign Application Priority Data

Sep. 29, 1992 [DE] Germany ............ 42 32 622.2

[51] Int. Cl.⁶ .................................................. H01R 13/62
[52] U.S. Cl. ..................... 439/329; 439/676; 439/344
[58] Field of Search ..................... 439/329, 344, 439/345, 67, 77, 638, 639, 676, 931

[56] References Cited

U.S. PATENT DOCUMENTS

| 4,191,441 | 3/1980 | Ryder et al. |
| 4,556,264 | 12/1985 | Tanaka. |
| 4,890,381 | 1/1990 | Dubois et al. |
| 5,336,099 | 8/1994 | Aldous et al. ..................... 439/131 |

FOREIGN PATENT DOCUMENTS

| 3108858 | 2/1982 | Germany. |
| 8813507 | 1/1989 | Germany. |
| 2212007 | 7/1989 | United Kingdom. |

*Primary Examiner*—Khiem Nguyen
*Attorney, Agent, or Firm*—Hill, Steadman & Simpson

[57] ABSTRACT

In the case of the conductor film (4) resting on a base the contact conductor tracks are arranged on a tab attachment (5) so as to run parallel to each other. Furthermore, in the base an open shaft (6) which runs obliquely downward is provided, on whose obliquely sloping bottom surface the tab attachment (5) with the contact conductor tracks which are free at the top comes to rest. For making contact, a plug socket, together with its contact spring element (8) passed outward and facing the bottom surface of the shaft (6), is inserted into the shaft (6) in the direction of the free tab end and is fastened in the end position in a locking manner.

10 Claims, 1 Drawing Sheet

CONTACT-MAKING DEVICE FOR CONNECTING A CONDUCTOR FILM WHICH HAS A PLURALITY OF CONTACT CONDUCTOR TRACKS

BACKGROUND OF THE INVENTION

The invention relates to a contact-making device for connecting a conductive line to a conductive film. More particularly, the present invention relates to a connective arrangement for a keyboard.

In the circuitry of electronic devices, not only the geometrical properties of the housing which accommodates the circuit have to be taken account of, but often also different technologies in the case of individual components and assemblies. A modular design, for example, conforms well with these different demands, even when it is a matter of essentially standardized and related functional groups, because one or the other circuit component, if required, can be easily separated or replaced with another similar or changed assembly. In addition, different production methods can be used depending on the technology used for the individual assemblies.

As is known, this modular design, however, also has the result that contact-making devices and possibly line connections have to be present on the connection points of the individual assemblies and functional units.

To counteract the outlay, connected therewith, in terms of multiple-plug connections the connector strip is saved, for example, in the case of printed circuit boards and replaced by parallel conductor tracks which are passed out to an outer edge and can make direct contact with the contact springs of a plug-on female strip connector. From there, a cable which is connected to the female strip connector leads to the plug connections of another assembly or to the external equipment plug.

Another measure for cost reduction consists in assigning the cable to one of the assemblies and fastening it thereto directly, that is to say without releasable plug connection. Nevertheless, directly fitting a cable to an assembly requires high outlay in terms of production, which often offsets the costs of the saved plug connection. In the case of conductor films which make possible a flexible conductor guidance similar to a cable, the functions of printed circuit board and cable can, on the one hand, be united in an ideal manner because a part of the conductor film can be provided with parallel conductor tracks which preferably end in a tab attachment of the conductor film so that this part assumes the function of a connecting cable. On the other hand, problems are created by the subsequent contact-making with a plug because the flexible tab attachment makes it considerably more difficult to plug on a female strip connector non-positively, in contrast to a rigid male connector strip.

For this reason, a device is already known which has a longitudinal rib which pushes the tab attachment out of the plane of the conductor film in the shape of an arc and against which the tab attachment nestles when the contact plug is plugged on (EP-A-0 284 855). Since the female strip connector of the contact plug is plugged on against the free end of the tab attachment, there is a substantial risk that the plug and the free tab end can jam.

SUMMARY OF THE INVENTION

The present invention is now based on the object of creating, for contact-making between a conductor film and a plug, a device which as far as possible is simple, safe, and prevents possible jamming.

To this end, the present invention provides a connector arrangement for connecting a keyboard connector film with an insertable plug. The conductor film is arranged in a base or housing. The film has a tab extension along one side thereof, and the tab extension forms a plurality of parallel contact tracks. The contact conductor tracks are formed by the tab extension. An open shaft is formed in the housing, the shaft having a bottom surface along which the contact conductor tracks are disposed, the conductor tracks being upwardly exposed. A plug socket is provided which is shaped to be cooperatively received in said shaft. The socket has a plurality of contact spring elements extending generally downwardly therefrom to contact with the respective contact conductor tracks. The socket is slidably insertably into the shaft in a locking manner.

In an embodiment, the shaft is arranged to run obliquely downwardly at an acute angle with respect to the housing.

In an embodiment, the contact spring elements have ends which are passed outward and which are operable as sliding contacts biased in an arc-shaped manner.

In an embodiment, the plug socket has a box-like shape. Furthermore, at least one displacement rib is provided on inner walls of the shaft and/or on the spatially assigned outer walls of the plug socket for fastening the plug socket in a play-free and positively locking manner.

In an embodiment, the plug socket has at least one locking stud which, in an assembled state of the plug socket, the locking stud dips into a depression in the spatially assigned shaft wall.

In an embodiment, each spring contact is arcuate in shape such that a rounded side of each contact is slidable along the respective track during insertion.

Additional features and advantages of the present invention are described in, and will be apparent from, the detailed description of the presently preferred embodiments and from the drawings.

BRIEF DESCRIPTION OF THE DRAWINGS

An exemplary embodiment of the invention is described below in more detail with reference to the drawing, in which.

DETAIL DESCRIPTION OF THE PREFERRED EMBODIMENTS

Figure 1:
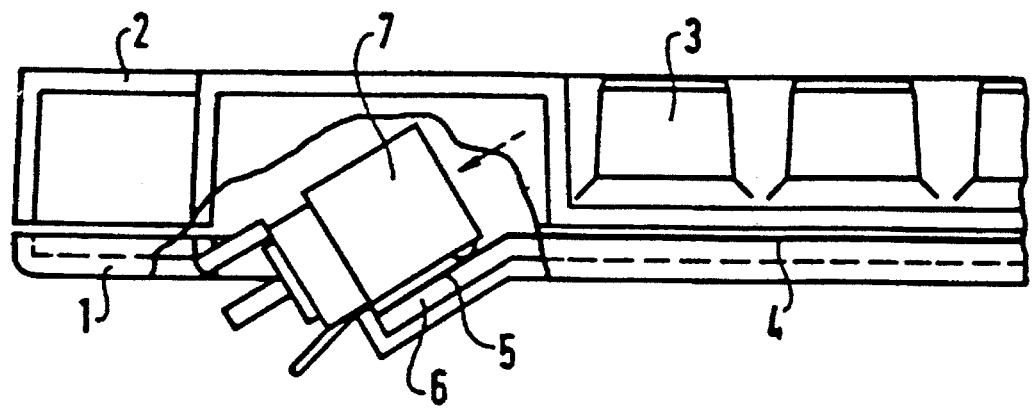
FIG. 1 shows a contact-making device according to the invention in a sectional representation using the example of a keyboard switching film.

FIG. 1 shows a sectional representation of the keyboard housing having a housing lower part constructed as bottom plate 1 and a housing upper part having a plurality of domes or push-buttons 3 arranged in one row. Each push-button is associated with a respective normally-open switch. The bottom plate 1 serves as base for a keyboard switching film 4. This keyboard switching film 4, which is essentially of rectangular shape, has preferably on an edge facing the rear panel of the housing, a tab attachment or tab extension which forms a plurality of parallel contact conductor tracks extending along a bottom of the shaft 6. Each track is upwardly exposed for connecting to a plug device. At a contact point with the plug connection the bottom surface 1 has an open shaft 6 which points obliquely downward and on whose downwardly sloping bottom surface the tab extension 5 with the contact conductor tracks which are free at the top comes to rest. A plug socket 7 is provided which is cooperatively shaped to be received in the shaft 6. The plug socket 7 is pushed into the shaft 6 in the direction of the free tab end (see arrow), the plug socket 7 having contact spring elements 8 which are passed out downwards biased in an arc-shaped manner and come to rest on the contact conductor tracks of the keyboard switching film 4 when the plug socket 7 is pushed in. In its inserted position, the plug socket 7 is secured either by a stop or by locking elements in the shaft 6.

Figure 2:
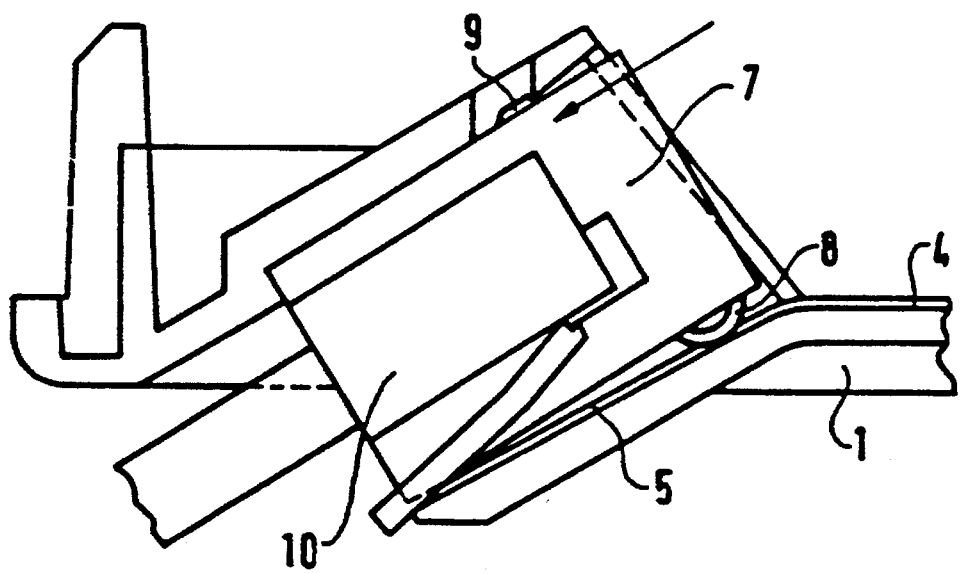
FIG. 2 shows an enlarged representation of the contact-making device according to FIG. 1.

FIG. 2 shows the contact-making device according to FIG. 1 in a slightly enlarged representation. It shows the shaft 6 which points obliquely downward in the bottom plate 1 of the keyboard housing, on the bottom surface of which shaft the tab attachment 5 of the keyboard switching film 4 comes to rest. The tab extension 5 is shaped to define the plurality of parallel contact conductor tracks. The plug socket 7 is pushed into this shaft 6 in the direction of the arrow, the contact spring elements 8 which are passed out downward in each case coming to rest in a resilient manner on the contact conductor tracks of the tab attachment 5. In the plugged-in state the plug socket is fastened either by a stop or by one or more locking elements 9 in the shaft 6. For fastening the plug socket, which has a box-like shape, in a play-free and positively locking manner, one or more displacement ribs are provided on the inner walls of the shaft 6 and/or on the spatially assigned outer walls of the plug socket 7. A associated plug 10 for the plug socket 7 is plugged in from outside via the end of the shaft 6, which end is downwardly open. The plug connection which is passed out on the housing underside obliquely downward has, compared to a plug arrangement on the housing rear panel, the advantage that the keyboard housing can be set up very closely in front of a computer housing or in front of any other limiting panel.

It should be understood that various changes and modifications to the presently preferred embodiments will be apparent to those skilled in the art. Such changes and modifications can be made without departing from the spirit and scope of the present invention and without diminishing its attendant advantages. Therefore, it is the intention of the inventors to cover such changes and modifications with the appended claims.

What is claimed is:

1. A connector arrangement comprising:
   a conductor film arranged in a housing, the film having a tab extension along one side thereof, the tab extension forming a plurality of parallel contact conductor tracks, the contact conductor tracks being formed by the tab extension;
   an open shaft formed in the housing having a bottom surface along which the contact conductor tracks are disposed, the conductor tracks being upwardly exposed; and
   a plug socket having a shape to be cooperatively received in said shaft, the socket having a plurality of contact spring elements extending generally downwardly therefrom to contact respective contact conductor tracks;
   wherein the socket is slidably insertably into the shaft in a locking manner.

2. The connector arrangement according to claim 1 wherein the shaft runs obliquely downwardly at an acute angle with respect to the housing.

3. The connector arrangement according to claim 1 wherein the contact spring elements have ends which are passed outward, and which are operable as sliding contacts biased in an arc-shaped manner.

4. The connector arrangement according to claim 1 wherein the plug socket has a box-like shape and wherein at least one displacement rib is disposed on inner walls of the shaft for fastening the plug socket in a play-free and positively locking manner.

5. The connector arrangement according to claim 4 wherein the plug socket has at least one locking stud which, in an assembled state of the plug socket, dips into a depression in a spatially assigned shaft wall.

6. The connector arrangement according to claim 1 wherein the plug socket has a box-like shape and wherein at least one displacement rib is disposed on spatially assigned outer walls of the plug socket for fastening the plug socket in a play-free and positively locking manner.

7. A connector comprising:
   a conductive film arranged in a keyboard housing;
   a tab extending from one side of the film, the tab defining a plurality of contact tracks;
   an open shaft formed in a bottom of the housing, the shaft being defined by shaft walls, the tab being disposed along one of the shaft walls;
   a socket plug shaped to be inserted into the shaft; and
   a plurality of spring contacts arranged on the socket plug for contacting respective tracks in an inserted condition.

8. The connector according to claim 7 wherein each spring contact is arcuate in shape such that a rounded side of each contact is slidable along the respective track during insertion.

9. The connector according to claim 7 wherein the shaft is generally directed obliquely downward relative to the housing.

10. The connector according to claim 7 further comprising:
    a locking stud extending from the plug socket; and
    a depression in one of the shaft walls to receive the stud upon insertion, locking the plug socket in the shaft.

* * * * *